United States Patent
Jung et al.

(10) Patent No.: US 7,782,680 B2
(45) Date of Patent: Aug. 24, 2010

(54) FLASH MEMORY DEVICE HAVING A VERIFY DATA BUFFER CAPABLE OF BEING EMPLOYED AS A PROGRAM DATA BUFFER, AND A METHOD THEREOF

(75) Inventors: Kee-ho Jung, Suwon-si (KR); Jae-yong Jeong, Yongin-si (KR); Chi-weon Yoon, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 278 days.

(21) Appl. No.: 12/003,589

(22) Filed: Dec. 28, 2007

(65) Prior Publication Data

US 2008/0170443 A1    Jul. 17, 2008

(30) Foreign Application Priority Data

Jan. 15, 2007    (KR) .................... 10-2007-0004406

(51) Int. Cl.
*G11C 11/34* (2006.01)

(52) U.S. Cl. ..................... 365/185.22; 365/185.19; 365/185.14

(58) Field of Classification Search ............ 365/185.22, 365/185.19, 185.14, 185.01, 222, 185.11, 365/185.21, 185.04, 189.05, 189.07
See application file for complete search history.

(56) References Cited

U.S. PATENT DOCUMENTS

| | | | |
|---|---|---|---|
| 5,903,497 A * | 5/1999 | Yu et al. ................. | 365/185.22 |
| 5,930,172 A | 7/1999 | Kucera | |
| 6,122,193 A | 9/2000 | Shibata et al. | |
| 6,259,628 B1 | 7/2001 | Park | |
| 7,057,934 B2 * | 6/2006 | Krishnamachari et al. ............ | 365/185.19 |
| 2005/0057995 A1 * | 3/2005 | Mitani et al. ................ | 365/222 |
| 2005/0286299 A1 * | 12/2005 | Tomita et al. .......... | 365/185.11 |

* cited by examiner

*Primary Examiner*—Dang T Nguyen
(74) *Attorney, Agent, or Firm*—Lee & Morse, P.C.

(57) ABSTRACT

A flash memory device includes a program data buffer configured to buffer program data to be programmed in a memory cell array, and a verify data buffer configured to compare verify data to confirm whether the program data is accurately programmed in the memory cell array, wherein at least a portion of the verify data buffer is selectively enabled as a verify data buffer or a program data buffer responsive to a buffer control signal.

18 Claims, 6 Drawing Sheets

Verify Data Buffer

Program Data Buffer

Verify Data Buffer

Program Data Buffer

Verify Data Buffer

Program Data Buffer

FLASH MEMORY DEVICE HAVING A VERIFY DATA BUFFER CAPABLE OF BEING EMPLOYED AS A PROGRAM DATA BUFFER, AND A METHOD THEREOF

BACKGROUND OF THE INVENTION

1. Field of the Invention

Embodiments relate to a flash memory device and, more particularly, to a flash memory device having a verify data buffer which, in addition to being employed as a verify data buffer, may be employed as a program data buffer, and a method thereof.

2. Description of the Related Art

In general, flash memory devices are an integrated non-volatile memory that may be electrically erased and programmed. Typical flash memory devices may have the advantages of RAM, which may allow data to be stored or accessed in any order, and the advantages of ROM, which may retain stored data when power is not supplied. Due at least in part to these advantages, flash memory devices are widely used as storage mediums of portable electronic devices such as digital cameras, personal digital assistants (PDAs), and MP3 players.

A single-level cell (SLC) flash memory may store one bit of data in one memory cell. On the contrary, a multi-level cell (MLC) flash memory may store two bits of data in one memory cell in order to increase the degree of integration.

One-bit data may be stored in a memory cell as two different programmed threshold voltages in the case of the single-level cell. As one example, if the threshold voltage programmed in a memory cell is about 1 to 3 volts, the data stored in the memory cell may represent logic 1. If the threshold voltage programmed in the memory cell is about 5 to 7 volts, the data stored in the memory cell may represent logic 0.

Two-bit data may be stored in a memory cell as four different programmed threshold voltages in the multi-level cell. As one example, if the threshold voltage programmed in a memory cell is about 1 to 3 volts, the data stored in the memory cell may represent logic 11. If the threshold voltage programmed in the memory cell is about 3.8 to 4.2 volts, the data stored in the memory cell may denote logic 10. If the threshold voltage programmed in the memory cell is about 4.9 to 5.4 volts, the data stored in the memory cell may represent logic 01. If the threshold voltage programmed in the memory cell is about 6.5 to 7.0 volts, the data stored in the memory cell may denote logic 00.

A flash memory cell device having a single-level cell or a multi-level cell may distinguish data stored in a memory cell based on the difference of cell current when a read operation is performed. Because the operations of the SLC flash memory device and the MLC flash memory are well-known to those skilled in the art, a detailed description thereof is omitted.

As described above, one cell may have two states in the SLC flash memory device, and one cell may have four states in the MLC flash memory device. Therefore, the MLC flash memory device may require a program and verify method that may have an increased accuracy as compared with the SLC flash memory device.

SUMMARY OF THE INVENTION

Embodiments are therefore directed to a flash memory device and a method of operating a flash memory device that may address one or more of the disadvantages of the related art.

It is therefore a feature of an embodiment of the present invention to provide a flash memory device having a verify data buffer that may be selectively enabled as a program data buffer.

It is therefore another feature of an embodiment of the present invention to provide a method of operating a flash memory device having a verify data buffer that may be selectively enabled as a program data buffer.

At least one of the above and other features of the present invention may be realized by providing a flash memory device including a program data buffer configured to buffer program data to be programmed in a memory cell array, and a verify data buffer configured to compare verify data to confirm whether the program data is accurately programmed in the memory cell array, wherein at least a portion of the verify data buffer is selectively enabled as a verify data buffer or a program data buffer responsive to a buffer control signal.

The flash memory device may further include a buffer controller configured to generate the buffer control signal. The verify data buffer may include a plurality of word buffers, wherein the plurality of word buffers are enabled by the buffer control signal. Enabling the plurality of word buffers as a verify data buffer may include providing a verify enable signal to at least a portion of the plurality of word buffers. Enabling the plurality of word buffers as a program data buffer may include providing a program enable signal to at least a portion of the plurality of word buffers.

The flash memory device may be configured to divide the program data corresponding to the size of the verify data buffer if the verify data buffer is operated as the program data buffer. The verify data buffer may be configured to verify data by overwriting verify data on the verify data buffer if the verify data buffer is enabled as a program data buffer. The verify data buffer may have a physical size approximately equal to the program data buffer, and may have a physical size identical to the program data buffer. The flash memory device may include a MLC (multi-level cell) flash memory.

At least one other of the above and other features of the present invention may be realized by providing a program/verify method for a flash memory device including buffering program data in a program data buffer, programming the program data in a memory cell array, and comparing verify data with the program data by employing a verify data buffer to at least partially determine whether the program data is accurately programmed, wherein at least a portion of the verify data buffer is enabled as a program data buffer responsive to a buffer control signal.

The buffer control signal may be generated by a buffer controller. The verify data buffer may include a plurality of word buffers. The buffer control signal may enable one or more of the plurality of word buffers.

Enabling one or more of the plurality of word buffers may include providing a verify enable signal to at least a portion of the plurality of word buffers.

The flash memory device may be configured to divide the program data corresponding to the size of the verify data buffer if the verify data buffer is operated as the program data buffer. The program/verify method for a flash memory device may further include overwriting verify data on the verify data buffer if the verify data buffer is enabled as a program data buffer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which.

DETAILED DESCRIPTION OF THE INVENTION

Figure 1:
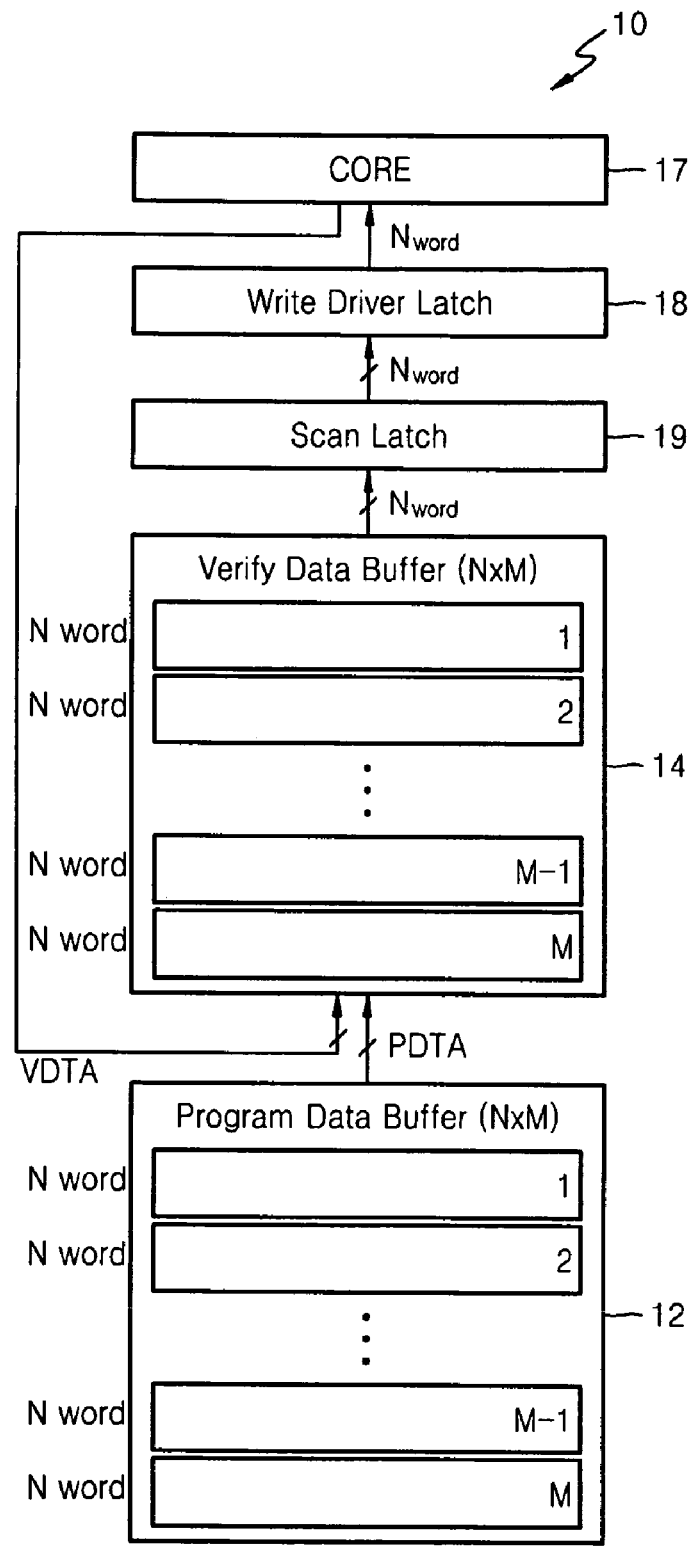
FIG. 1 illustrates a block diagram of a data buffer scheme in a multi-level cell flash memory device in accordance with an embodiment.

Korean Patent Application No. 10-2007-0004406, filed on Jan. 15, 2007, in the Korean Intellectual Property Office, and entitled: "Flash Memory Device Having Verify Data Buffer Capable of Changing Application and Program/Verify Method Thereof," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the accompanying drawings, dimensions may be exaggerated for clarity of illustration. Furthermore, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items. Additionally, like reference numerals may refer to like elements throughout the drawings.

Additionally, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," and the like).

FIG. 1 illustrates a block diagram of a data buffer scheme in a multi-level cell flash memory device in accordance with an embodiment.

As illustrated in FIG. 1, a multi-level cell (MLC) flash memory device 10 may include a program data buffer 12 and a verify data buffer 14. The program data buffer 12 may buffer program data PDTA to be programmed in a core 17 of a flash memory device. The program data buffer 12 may transmit the program data PDTA to the verify data buffer 14.

The program data PDTA stored in the verify data buffer 14 may be programmed in the core 17 after passing through a scan latch 19 and a write driver latch 18. Data programmed in the core 17 may include verify data VDTA and may be input to the verify data buffer 14. The verify data buffer 14 may compare the verify data VDTA with the program data PDTA stored in the verify data buffer 14.

In operation, the MLS flash memory may compensate for a comparatively slow programming speed, which may be slower than that of the SLC flash memory device, by employing a program data buffer. The MLC flash memory device may also improve the programming characteristics by employing the verify data buffer.

The program data buffer and the verify data buffer may have the same physical size, for example, a size of N×M as shown in FIG. 1, although the scope of the subject matter is not so limited. Additionally, the verify data buffer of FIG. 1 may typically only be employed in verifying operations.

Accordingly, the MLS flash memory device may require an additional program data buffer in order to increase the total quantity of programmable data that the program data buffer may buffer. Furthermore, the MLS flash memory device may require a verifying data buffer having approximately the same size as the additional program data buffer.

Figure 2:
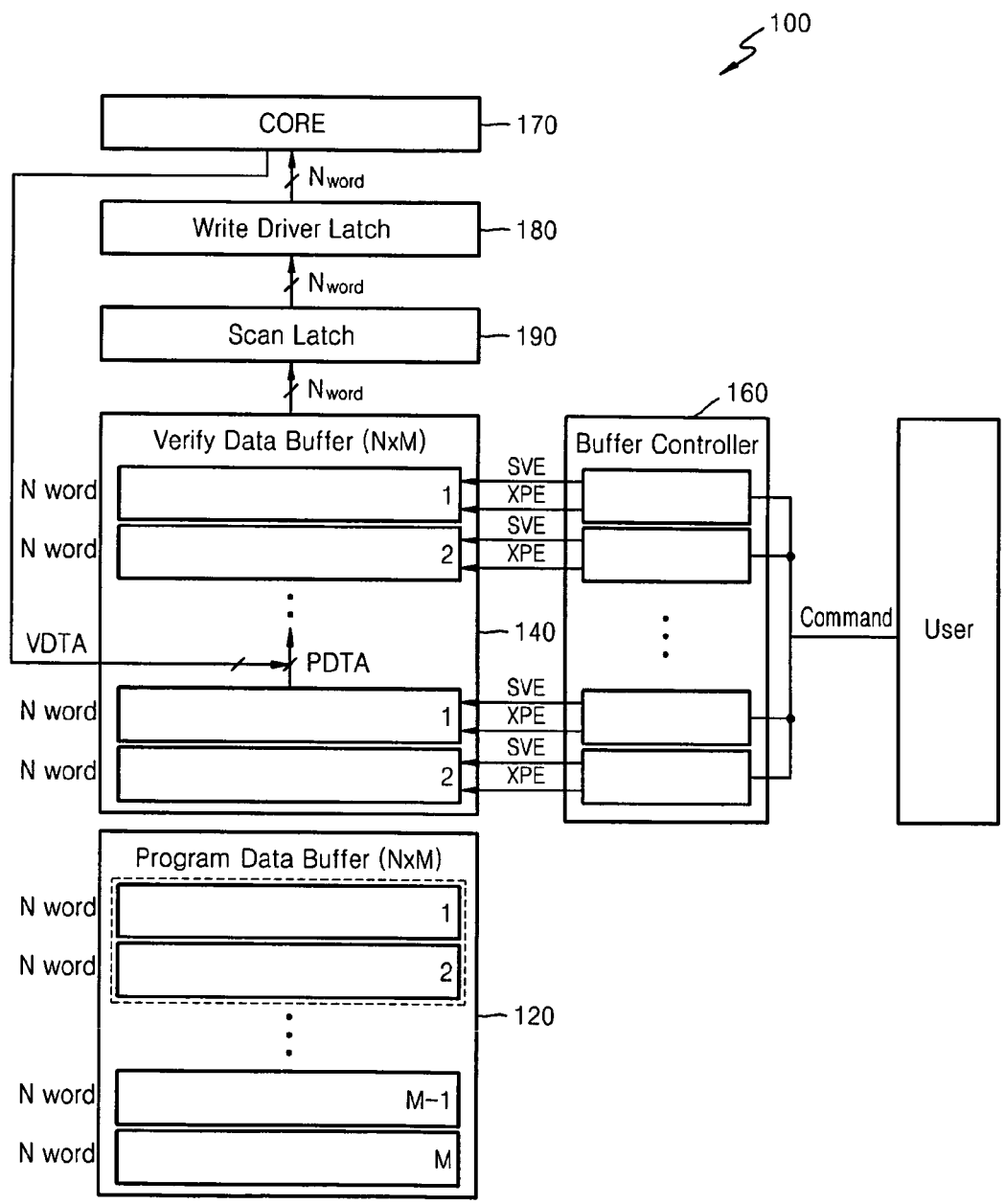
FIG. 2 illustrates a block diagram of a data buffer scheme in a flash memory device in accordance with an embodiment.

FIG. 2 illustrates a block diagram of a data buffer scheme employed in a flash memory device according to an embodiment of the present invention. As illustrated in FIG. 2, the flash memory device 100 may include a program data buffer 120 and a verify data buffer 140. The flash memory device 100 of FIG. 2 may be a multi-level cell (MLC) flash memory, for example.

The program data buffer 120 and the verify data buffer 140 may include M N-word buffers each of which may store and buffer N words. Therefore, FIG. 2 illustrates the program data buffer 120 and the verify data buffer 140 having N×M word size where N and M are natural numbers. In at least one embodiment, the physical sizes of the program data buffer 120 and the verify data buffer 140 may be identical. However, it is worthwhile to note that the scope of the subject matter is not so limited.

In operation, the program data buffer 120 may buffer program data PDTA to be programmed in a memory cell array core 170. The program data buffer 120 may transmit the program data PDTA to the verify data buffer 140.

The verify data buffer 140 may buffer the program data PDTA transmitted from the program data buffer 120 and may transmit the buffered PDTA to the scan latch 190 in a unit of N words. The scan latch 190 may transmit the buffered PDTA to the write driver latch 180, and the write driver latch 180 may program the buffered PDTA into the core 170.

The data programmed into the core 170 may be input to the verify data buffer 140 as verify data VDTA, which may be employed to perform verify operations. The verify data buffer 140 may compare the input verify data VDTA with the stored program data PDTA.

In at least one embodiment, it may be possible to employ the entire verify data buffer 140 or a predetermined portion of the verify data buffer 140 as a program data buffer. That is, the entire verify data buffer 140 or a predetermined portion of the verify data buffer 140 may be employed as a program data buffer, and another portion of the verify data buffer 140 may be employed in the same manner as the original verify data buffer 140 was intended to be utilized, in order to compare the program data PDTA with the verify data VDTA.

Whether to employ the entire verify data buffer 140 or a predetermined portion of the verify data buffer 140 as a program data buffer may be determined based at least in part on buffer control signals XPE (program enable signal) and SVE (verify enable signal). The flash memory device 100 may further include a buffer controller 160 for generating the buffer control signals XPE and SVE. The buffer controller 160 may generate the buffer control signals XPE and SVE in response to a command to control the use of each word buffer in the verify data buffer 140. For example, if word buffers corresponding to the buffer control signals XPE and SVE are employed as the verify data buffer 140, the verify enable signal SVE may be transmitted to the corresponding word buffers. Alternatively, if word buffers corresponding to the buffer control signals XPE and SVE are employed as the program data buffer 120, the program enable signal XPE may be transmitted to the corresponding word buffer.

Figure 3A:
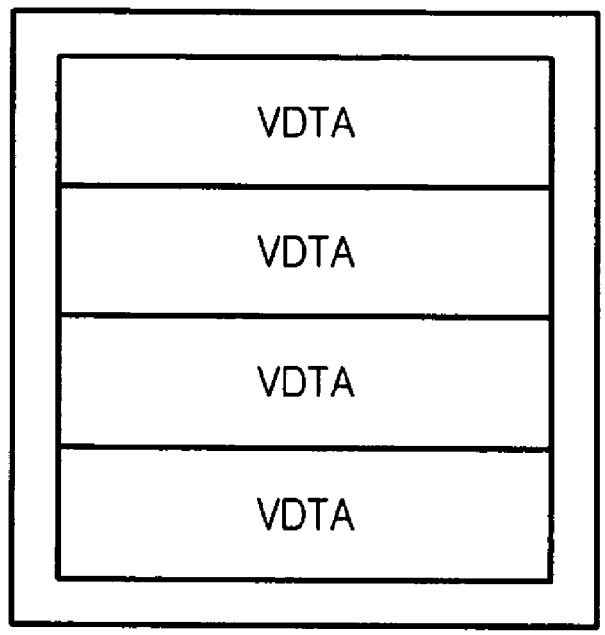
FIG. 3A through FIG. 3C illustrate diagrams of various embodiments of a program data buffer and a verify data buffer shown in FIG. 2.
Figure 3A:
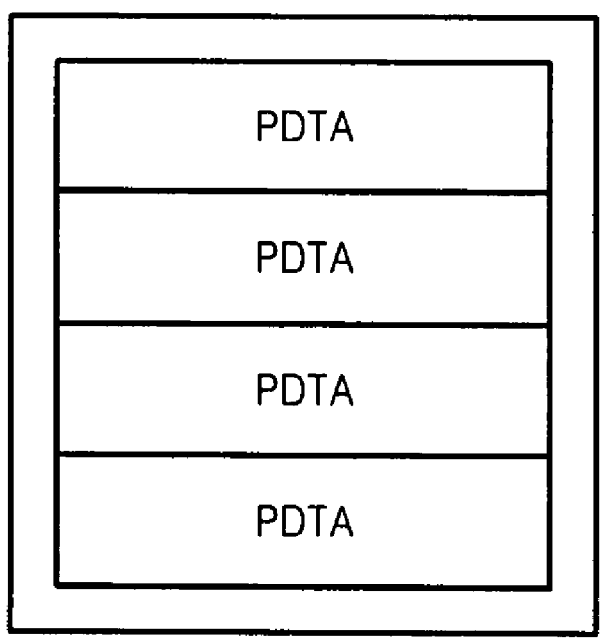
Figure 3B:
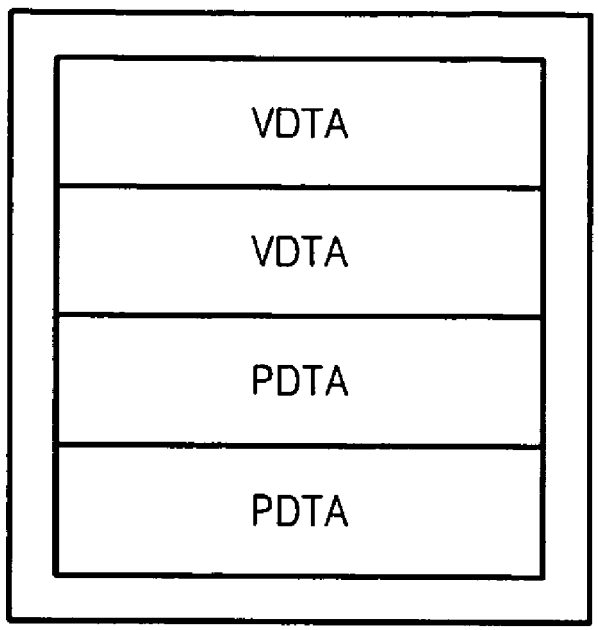
Figure 3B:
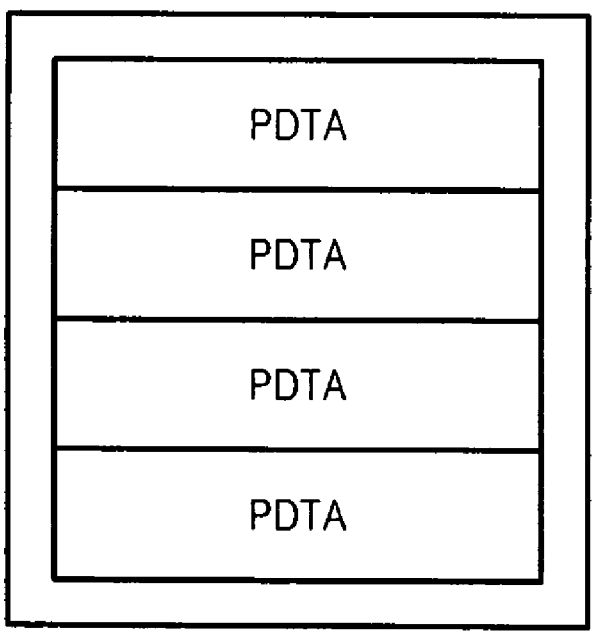
Figure 3C:
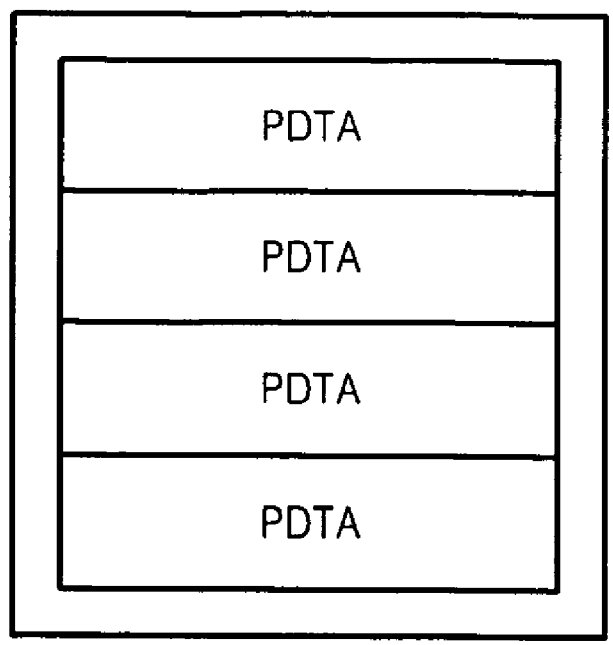
Figure 3C:
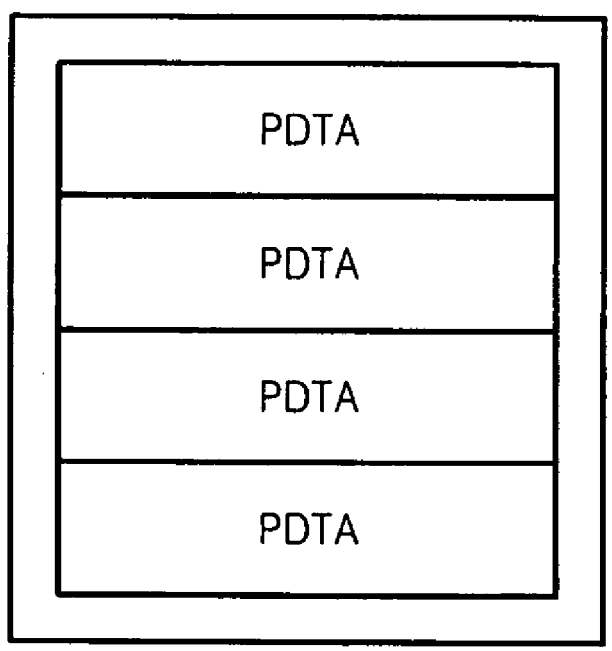

FIG. 3A through FIG. 3C illustrate diagrams of various embodiments of a program data buffer and a verify data buffer illustrated in FIG. 2.

As illustrated in FIG. 3A through FIG. 3C, the program data buffer 120 and the verify data buffer 140 illustrated in FIG. 2 may each include four word buffers. In other words, the physical sizes of the program data buffer 120 and the verify data buffer 140 may be approximately equal or identical to N×M, where N and M may be natural numbers. The word buffers of the program data buffer and the verify data buffer may include verify data VDTA or program data PDTA, depending on whether the word buffers are enabled as verify data buffers or program data buffers, for example.

FIG. 3A illustrates an embodiment where the program data buffer 120 and the verify data buffer 140 may have the same N×M word size. FIG. 3B illustrates the program data buffer 120 and the verify data buffer 140 if a predetermined portion of the verify data buffer 140 is enabled as a program data buffer. In particular, FIG. 3B illustrates that half of the verify data buffer 140 has been selectively enabled as a program data buffer, denoted as PDTA. Additionally, FIG. 3C illustrates the program data buffer 120 and the verify data buffer 140 when the entire verify data buffer 140 is selectively enabled as a program data buffer, also denoted as PDTA.

Figure 4:
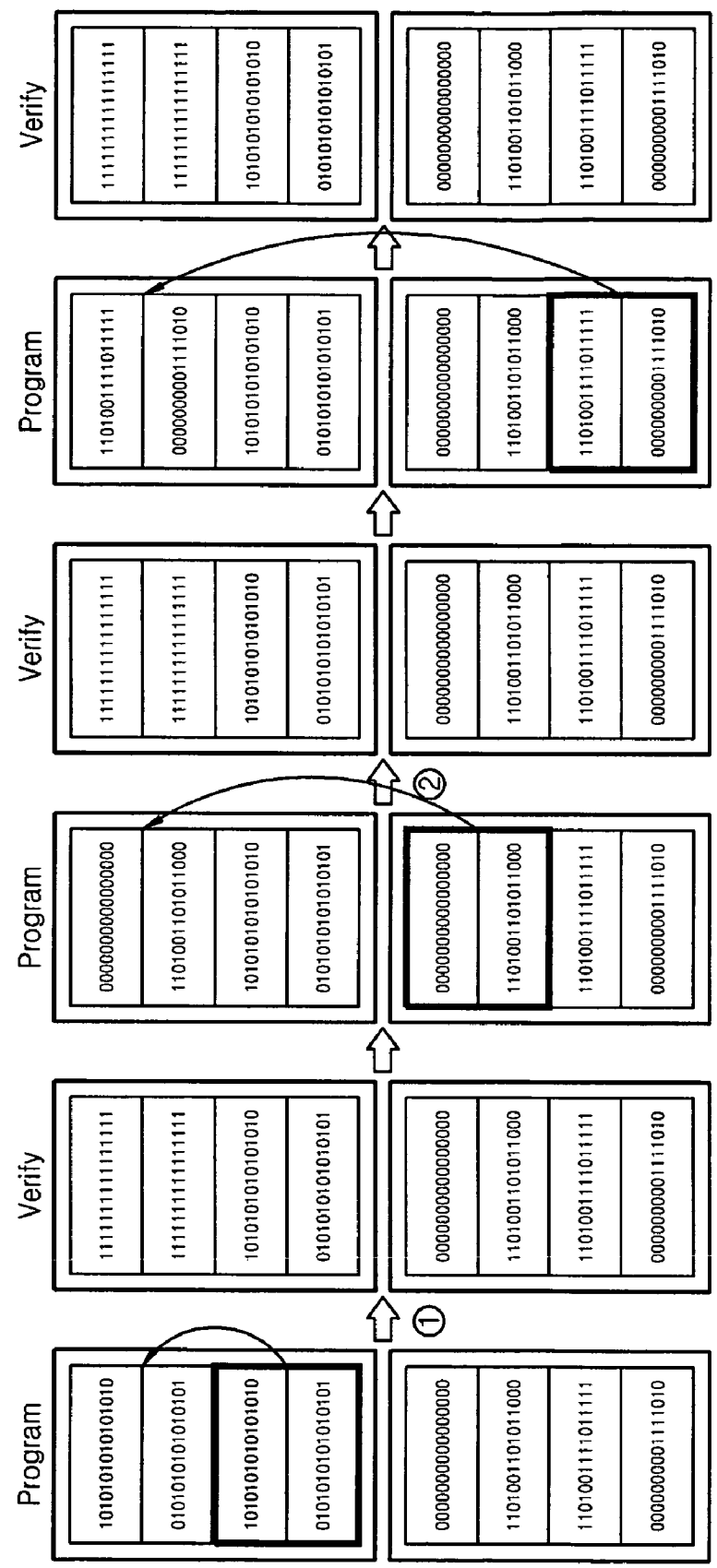
FIG. 4 illustrates a diagram of a data program/verify method of a flash memory device having a program data buffer and a verify data buffer shown in FIG. 3B in accordance with an embodiment.

FIG. 4 illustrates a diagram of a data program/verify method for a flash memory device having a program data buffer and a verify data buffer in accordance with an embodiment. The method may be performed in a memory device such as the memory device illustrated in FIG. 3B, as just an example.

In this embodiment, referring to FIG. 3B and FIG. 4, the flash memory device 100 may divide the program data PDTA corresponding to a size of the predetermined portion of the verify data buffer 140 enabled as a program data buffer, and may sequentially program the divided PDTA in the portion of the verify data buffer 140 enabled as a program data buffer. For example, if the verify data buffer 140 shown in FIG. 4 has a word buffer size of 2N, and if the program data buffer 120 has a word buffer size of 6N, the 6N words may be divided into 2N words corresponding to the 2N word buffer size, which may then be programmed in the verify data buffer 140. In this example, the programming operations may be performed three times in order to program the 6N words into the verify data buffer, as indicted by elements 1-3 in FIG. 4.

Alternatively, if the entire verify data buffer 140 is enabled as a program data buffer, as shown in FIG. 3C, the program data PDTA may not be transmitted from the program data buffer 120 to the verify data buffer 140. Rather, the program data PDTA may be compared with verify data VDTA by overwriting verify data VDTA on the program data PDTA provided to the verify data buffer 140.

As described above, the flash memory device according to the present embodiment may increase the amount of programmable data without the need for additional program data buffer or verify data buffer, by driving the entire verify data buffer or a predetermined portion of the verify data buffer as the program data buffer.

A program/verify method of a flash memory device according to an embodiment of the present invention includes a buffering operation for buffering program data to be programmed to a memory cell array in a program data buffer, a programming operation for programming the program data to the memory cell array, and a comparing operation for comparing verify data with the program data using a verify data buffer to confirm whether the program data is accurately programmed with the program data. In at least one embodiment, it may be possible to change the entire verify data buffer or a predetermined portion of the verify data buffer to operate as a program data buffer responsive to a buffer control signal. The program/verify method for a flash memory device according to the present embodiment may be employed in a flash memory device.

As described above, the flash memory device and the program/verify method for the flash memory according to the embodiments of the present invention may have advantages including increasing the amount of programmable data without having an additional program data buffer and verify data buffer by driving the entire verify data buffer or a predetermined portion of the verify data buffer as the data buffer.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flash memory device, comprising:
    a program data buffer configured to buffer program data to be programmed in a memory cell array; and
    a verify data buffer configured to compare verify data to confirm whether the program data is accurately programmed in the memory cell array, wherein:
    at least a portion of the verify data buffer is selectively enabled as the verify data buffer or the program data buffer responsive to a buffer control signal, and
    the verify data buffer is configured to verify data by overwriting verify data on the verify data buffer if the verify data buffer is enabled as a program data buffer.

2. The flash memory device as claimed in claim 1, further comprising a buffer controller configured to generate the buffer control signal.

3. The flash memory device as claimed in claim 2, wherein the verify data buffer includes a plurality of word buffers, and the plurality of word buffers are enabled by the buffer control signal.

4. The flash memory device as claimed in claim 3, wherein enabling the plurality of word buffers as the verify data buffer comprises providing a verify enable signal to at least a portion of the plurality of word buffers.

5. The flash memory device as claimed in claim 3, wherein enabling the plurality of word buffers as the program data buffer comprises providing a program enable signal to at least a portion of the plurality of word buffers.

6. The flash memory device as claimed in claim 1, wherein the flash memory device is configured to divide the program data corresponding to the size of the verify data buffer if the verify data buffer is operated as the program data buffer.

7. The flash memory device as claimed in claim 1, wherein the verify data buffer has a physical size approximately equal to the program data buffer.

8. The flash memory device as claimed in claim 1, wherein the verify data buffer has a physical size identical to the program data buffer.

9. The flash memory device as claimed in claim 1, wherein the flash memory device comprises a MLC (multi-level cell) flash memory.

10. A program/verify method for a flash memory device, comprising:
   buffering program data in a program data buffer;
   programming the program data in a memory cell array; and
   comparing verify data with the program data by employing a verify data buffer to at least partially determine whether the program data is accurately programmed, wherein:
   at least a portion of the verify data buffer is enabled as the program data buffer responsive to a buffer control signal, and
   the verify data buffer is configured to verify data by overwriting verify data on the verify data buffer if the verify data buffer is enabled as a program data buffer.

11. The program/verify method as claimed in claim 10, wherein the buffer control signal is generated by a buffer controller.

12. The program/verify method as claimed in claim 10, wherein the verify data buffer comprises a plurality of word buffers.

13. The program/verify method as claimed in claim 12, wherein the buffer control signal enables one or more of the plurality of word buffers.

14. The program/verify method as claimed in claim 12, wherein enabling one or more of the plurality of word buffers comprises providing a verify enable signal to at least a portion of the plurality of word buffers.

15. The program/verify method as claimed in claim 10, wherein the flash memory device is configured to divide the program data corresponding to the size of the verify data buffer if the verify data buffer is operated as the program data buffer.

16. The program/verify method as claimed in claim 10, wherein the verify data buffer has a physical size approximately equal to the program data buffer.

17. The program/verify method as claimed in claim 10, wherein the verify data buffer has a physical size identical to the program data buffer.

18. The program/verify method as claimed in claim 10, wherein the flash memory device comprises a MLC (multi-level cell) flash memory.

* * * * *